United States Patent
Kumar et al.

(10) Patent No.: US 7,407,871 B2
(45) Date of Patent: Aug. 5, 2008

(54) METHOD FOR PASSIVATION OF PLASMA ETCH DEFECTS IN DRAM DEVICES

(75) Inventors: Arvind Kumar, Singapore (SG); Keen Wah Chow, Singapore (SG); Devesh Kumar Datta, Singapore (SG); Subramanian Krishnan, Singapore (SG)

(73) Assignee: TECH Semiconductor Singapore Pte Ltd, Singapore (SG)

( * ) Notice: Subject to any disclaimer, the term of this patent is extended or adjusted under 35 U.S.C. 154(b) by 0 days.

(21) Appl. No.: 11/515,534

(22) Filed: Sep. 5, 2006

(65) Prior Publication Data
US 2008/0124814 A1 May 29, 2008

(51) Int. Cl.
*H01L 21/322* (2006.01)

(52) U.S. Cl. .................... 438/471; 438/473
(58) Field of Classification Search ......... 438/471–475, 438/516
See application file for complete search history.

(56) References Cited

U.S. PATENT DOCUMENTS

| | | | |
|---|---|---|---|
| 3,849,204 A | 11/1974 | Fowler | |
| 4,332,627 A | 6/1982 | Schmitt et al. | |
| 4,835,006 A | 5/1989 | Grasser et al. | |
| 6,483,172 B1 | 11/2002 | Cote et al. | |
| 6,709,906 B2 | 3/2004 | Yamaguchi et al. | |
| 6,803,266 B2 | 10/2004 | Solomon et al. | |
| 7,015,088 B2 * | 3/2006 | Colombo et al. | 438/240 |
| 2004/0104406 A1 | 6/2004 | Derycke et al. | |
| 2004/0127000 A1 | 7/2004 | Colombo et al. | |
| 2006/0024928 A1 | 2/2006 | Seebauer et al. | |

OTHER PUBLICATIONS

"Gate-Induced Drain Leakage (GIDL)", *Silicon Processing for the VLSI Era*, vol. III, pp. 198-201, by Wolf, published by Lattice Press, 1995.
"Passivation of Dry-Etching Damage Using Low-Energy Hydrogen Implants", IEEE Electron Device Letters, vol. EDL-4, No. 12, Dec. 1983, J.S. Wang et al., pp. 432-435.

* cited by examiner

*Primary Examiner*—Hsien-ming Lee
(74) *Attorney, Agent, or Firm*—Saile Ackerman LLC; Stephen B. Ackerman

(57) ABSTRACT

A process for fabricating an MOS device specifically a DRAM device, featuring passivation of defects in regions of a semiconductor substrate wherein defects left unpassivated can deleteriously influence data retention time, has been developed. A high density plasma dry etching procedure used to define the DRAM conductive gate electrode can create unwanted defects in a region near the surface of uncovered portions of the semiconductor substrate during the high density plasma procedure over etch cycle. Implantation of a group V element such as arsenic can be used to passivate the unwanted plasma etch defects, thus reducing the risk of defect related device leakage phenomena. However to insure the group V implanted species remain at or near the semiconductor surface for optimum defect passivation, the group V element implantation procedure is performed after all high temperature DRAM fabrication steps, such as selective oxidation for creation of oxide spacers on the sides of the conductive gate electrode, have been completed. A slow diffusing implanted arsenic ion is the optimum candidate for passivation while faster diffusing group V elements such as phosphorous are not as attractive for defect passivation.

18 Claims, 4 Drawing Sheets

METHOD FOR PASSIVATION OF PLASMA ETCH DEFECTS IN DRAM DEVICES

BACKGROUND OF THE INVENTION (1) Field of the Invention

The present invention relates to methods of fabricating semiconductor devices, and more specifically to a method for passivating defects on a semiconductor substrate wherein the defects are a result of plasma etching procedures.

(2) Description of Prior Art

Dynamic Random Access Memory (DRAM) devices require specific elements to retain induced charge for significant periods of DRAM operation. The ability of the DRAM elements to retain charge, or data retention time, is strongly influenced by the perfection or defect density of the portion of semiconductor substrate used for DRAM stored charge elements. Unwanted defects in portions of the semiconductor substrate will result in charge leakage, low retention time, and thus poor device yield and performance. Unfortunately several semiconductor device fabrication procedures can create defects in semiconductor substrates thus challenging the ability to fabricate efficient DRAM devices. Plasma dry etching processes such as reactive ion etching (RIE), specifically high density plasma procedures performed to define many critical features in scaled down (smaller geometries) semiconductor devices, can result in damage in the form of defect generation at semiconductor substrate. These defects lead to unsaturated chemical bonds at the semiconductor surface promoting charge leakage from storage elements of a DRAM device. The data retention time loss or charge leakage mechanisms suffered by DRAM devices can be in the form of junction leakage and defect assisted gate induced drain leakage (GIDL).

The present invention will feature passivation of the surface defects caused by high density plasma etching procedures via introduction of a passivating dopant at the semiconductor surface performed after high temperature fabrication procedures have already been executed thus maintaining the passivating dopant at or near the surface of the semiconductor substrate. Numerous attempts at improving data retention time have focused on semiconductor substrate defect reduction, however most of these works involve major and costly process or design modification. Prior art such as Schmitt et al U.S. Pat. No. 4,332,627, as well as Colombo et al US Pat. No. US2004/0127000 A1, teach methods of eliminating process induced defects via use of high temperature anneals after arsenic processing, however these prior art result in arsenic being driven into the semiconductor substrate away from the top surface where plasma etch induced defects are formed. Other prior art such as Cote et al U.S. Pat. No. 6,483,172 B1, Yamaguchi et al U.S. Pat. No. 6,709,906 B2, Fowler U.S. Pat. No. 3,849,204, Solomon et al U.S. Pat. No. 6,803,266 B2, Derycke US Pat. No. US2004/0104406 A1, and Grasser et al U.S. Pat. No. 4,835,006, disclose various processes and procedures for reduction of semiconductor defects, however none of these features of the present invention in which surface defects are reduced via use of specific group V elements introduced at a point in the fabrication process wherein all high temperature procedures have already been performed.

SUMMARY OF THE INVENTION

It is an object of this invention to fabricate a metal oxide semiconductor (MOS) device such as a dynamic random access memory (DRAM) device, on a semiconductor substrate.

It is another object of this invention to passivate defects at or near the surface of a semiconductor substrate.

It is still another object of this invention to passivate defects at or near the surface of a semiconductor substrate, defects resulting from high density plasma etching procedures, via implantation of group V elements with atomic mass equal or greater than arsenic.

It is still yet another object of this invention to perform the implantation of group V elements after all high temperature device processing has been completed.

In accordance with the present invention a method of passivating defects at or near the surface of a semiconductor substrate via implantation of group V elements with atomic mass equal or greater than arsenic, performed after high temperature device fabrication processes have been completed, is described. After gate insulator growth blanket deposition of gate electrode materials is accomplished. Definition of a gate electrode structure is next obtained via conventional photolithographic and high density plasma dry etching procedures, with the portions of the semiconductor substrate not covered by the defined gate electrode structure damaged at or near the semiconductor substrate surface. After implantation of ions used for a source/drain region a selective oxidation procedure is employed to form oxide sidewalls on specific portions of the gate electrode structure while activating the implanted source/drain ions. A group V element with atomic mass equal or greater than arsenic is next implanted in a top portion of the semiconductor substrate passivating the defects in the damaged region of the semiconductor substrate. After formation of insulator spacers on the sides of the gate electrode structure a selective silicon growth procedure is employed to form raised source/drain contact regions.

BRIEF DESCRIPTION OF THE DRAWINGS

The object and other advantages of this invention are best described in the preferred embodiments with reference to the attached drawings which include:

FIG. 1, schematically describes the first stage of a process used to form a shallow trench isolation region.

FIG. 2, schematically describes the final stage of the process used to form a shallow trench isolation region.

FIG. 3, schematically describes the attainment of the materials needed for a subsequent gate structure.

FIG. 4, schematically describes the definition procedure used to form the gate structure.

FIG. 5, schematically describes the procedure used to selectively form an insulator layer of specific portions of the gate structure, and describes the implantation procedure used to form a subsequent source/drain region.

FIG. 6, schematically describes the procedure used to passivate plasma etch defects.

FIG. 7, schematically describes the formation of composite insulator sidewalls on the gate structure.

FIG. 8, schematically describes the formation of raised source/drain regions.

DESCRIPTION OF THE PREFERRED EMBODIMENT

Figure 1:
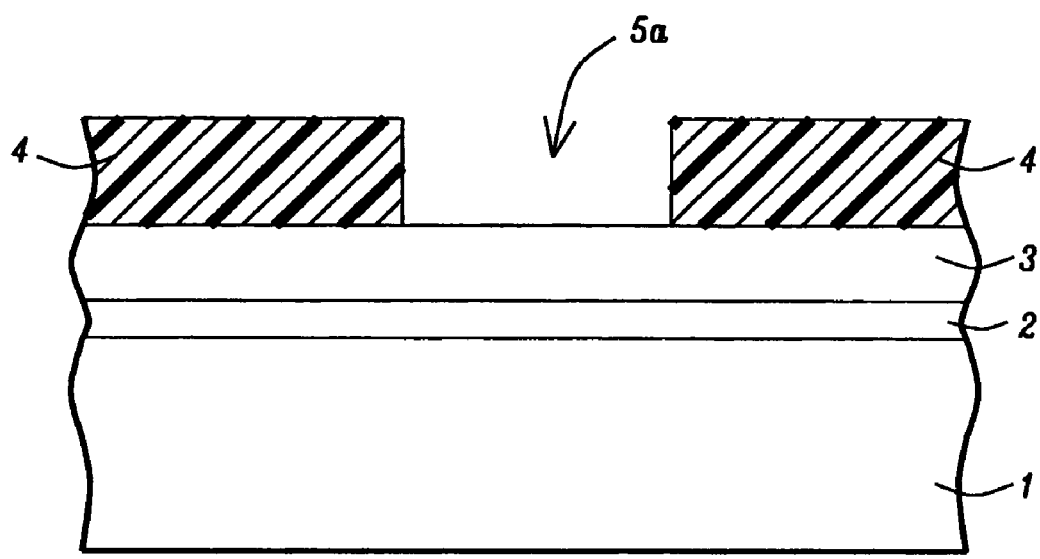
FIGS. 1-8, schematically in cross-sectional style describe key fabrication stages used to form a metal oxide semiconductor (MOS) device wherein implantation of group V elements with atomic mass equal or greater than arsenic is employed to passivate defects created at or near the surface of a semiconductor substrate, defects which resulted from high density plasma etching procedures.

A process used to fabricate a metal oxide semiconductor (MOS) device, specifically a DRAM device, wherein implantation of group V elements with atomic mass equal or greater than arsenic is employed to passivate defects created at or near the surface of a semiconductor substrate, defects which resulted from high density plasma etching procedures, will now be described in detail. Semiconductor substrate 1 comprised of single crystalline silicon, with a <100> crystallographic orientation is shown schematically in FIG. 1. Insulator layer 2 comprised of silicon dioxide, is next thermally grown to a thickness between about 90 to 100 Angstroms, in an oxygen-steam ambient at a temperature between about 900 to 920° C. Silicon nitride layer 3 is next formed on insulator layer 2, via chemical vapor deposition (CVD) procedures, such as low pressure chemical vapor deposition (LPCVD), or plasma enhanced chemical vapor deposition (PECVD). Silicon nitride layer 3 is grown to a thickness between about 475 to 525 Angstroms. Photolithographic shape 4 featuring space 5a is next formed on silicon nitride layer 3. This is shown schematically in FIG. 1.

Figure 2:
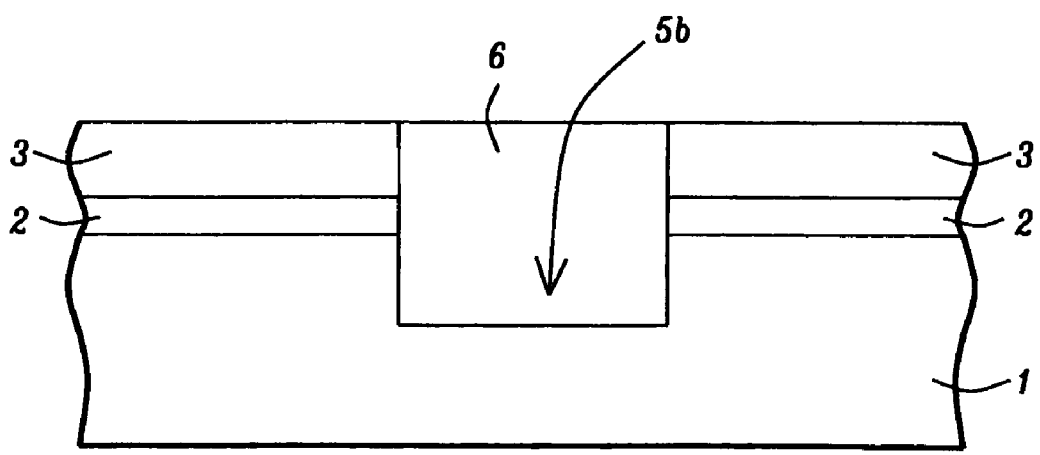

Dry etching procedures, such as reactive ion etching (RIE), is next employed using photolithographic shape 4 and opening 5a as an etch mask to define shallow trench shape 5b in silicon nitride layer 3, in insulator layer 2, and in a top portion, between about 3500 to 3700 Angstroms, of semiconductor substrate 1. The RIE procedure is performed using $CF_4$ or $Cl_2$ as an etchant for silicon nitride while $CHF_3$ is used to define opening 5b in insulator layer 2. The definition of shallow trench shape 5b in the top portion of semiconductor substrate 1 is accomplished via the RIE procedure using $Cl_2$ as an etchant for silicon. After definition of shallow trench shape 5b photolithographic shape 4 is removed via plasma oxygen ashing and wet clean procedures. Insulator layer 6, a layer such as silicon dioxide, is next deposited via LPCVD or PECVD procedures at a thickness between about 4000 to 4500 Angstroms, completely filling shallow trench shape 5b. Removal of unwanted portions of insulator layer 6 from the top surface of silicon nitride layer 3 is accomplished via either a selective chemical mechanical polishing (CMP) procedure, or via a dry etch procedure using $CHF_3$ as a selective etchant for insulator layer 6. The above procedures result in insulator filled shallow trench shape 5b filled with insulator layer 6, to be used for device isolation purposes. This is schematically shown in FIG. 2.

Figure 3:
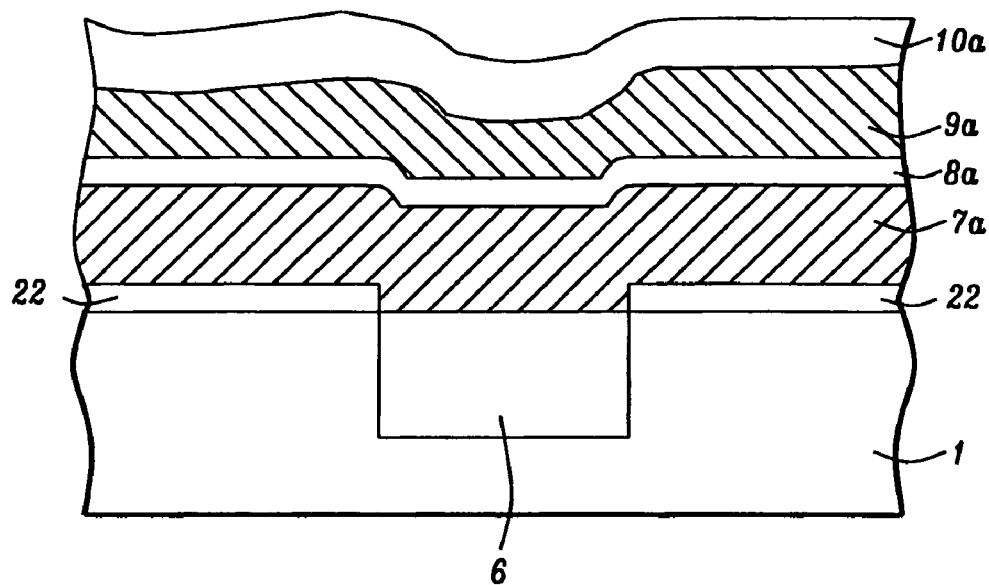

After formation of insulator filled shallow trench shape 6, silicon nitride layer 3 as well as insulator layer 2 are removed using either dry or wet etch procedures. Silicon dioxide layer 22, to be used as the gate insulator layer for the memory device, is next thermally grown at a temperature between about 740 to 760° C. in an oxygen-steam ambient, at a thickness between about 55 to 65 Angstroms. Materials to be used for definition of a gate electrode structure are next formed on gate insulator layer 22 and schematically shown in FIG. 3. Polysilicon layer 7a is first deposited via LPCVD or PECVD procedures at a thickness between about 670 to 730 Angstroms. Polysilicon layer 7a can either be deposited via in situ doping procedures wherein arsine or phosphine is included with silane gas, or polysilicon layer 7a can be intrinsically deposited then doped via implantation of arsenic or phosphorous ions. Barrier layer 8a comprised of tungsten nitride is next formed at a thickness between about 140 to 160 Angstroms via CVD or via plasma vapor deposition (PVD) procedures. Desired barrier layer 8a can also be comprised of titanium nitride. Layer 9a comprised of tungsten is next deposited on barrier layer 8a via LPCVD or PVD procedures at a thickness between about 90 to 110 Angstroms. Layer 9a is employed to reduce the resistance of a subsequently formed gate electrode structure, therefore other conductive materials such as molybdenum can also be used. A capping silicon nitride layer 10a, is next grown on layer 9a at a thickness between about 1425 to 1575 Angstroms, again via LPCVD or PECVD procedures.

Figure 4:
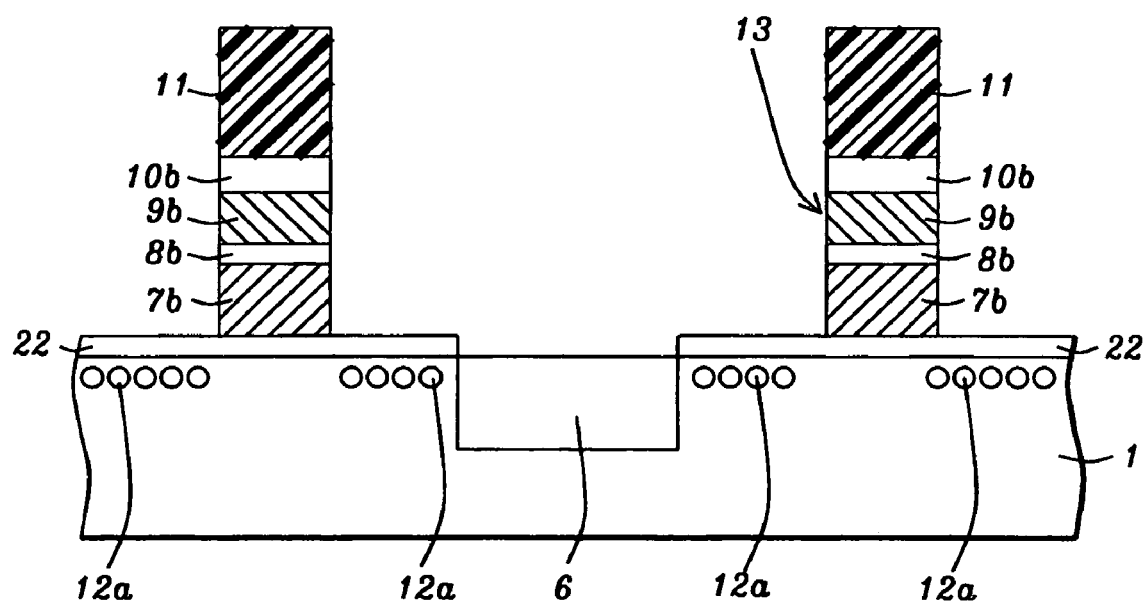

Photolithographic shape 11 is next formed on the gate silicon nitride layer 10b and used as an etch mask to define gate electrode structures. A plasma dry etch procedure such as an anisotropic RIE procedure is employed to remove the portions of material not covered by photolithographic shape 11, using $Cl_2$ as an etchant for silicon nitride layer 10a, for tungsten layer 9a, for tungsten nitride or titanium nitride layer 8a, and for polysilicon layer 7a, with the anisotropic RIE procedure selectively terminating at the top surface of exposed gate insulator layer 22. The result of the above procedures result in the definition of gate electrode stack 13 on gate insulator layer 22, shown schematically in FIG. 4, with the gate electrode stack comprised of silicon nitride shape 10b, tungsten shape 9b, tungsten nitride or titanium nitride shape 8b, and polysilicon shape 7b. Although the high energy plasma dry etching procedure selectively terminates at the surface of gate insulator layer 22 damage of underlying portions of semiconductor substrate 1 can still occur creating defects 12a near the top surface of semiconductor substrate 1. Defects 12a schematically shown in FIG. 4, if left remaining will cause leakage in specific regions of a memory device such as access areas and storage node junctions, with the unwanted leakage resulting in the degradation of data retention time in devices such as DRAMs.

Figure 5:
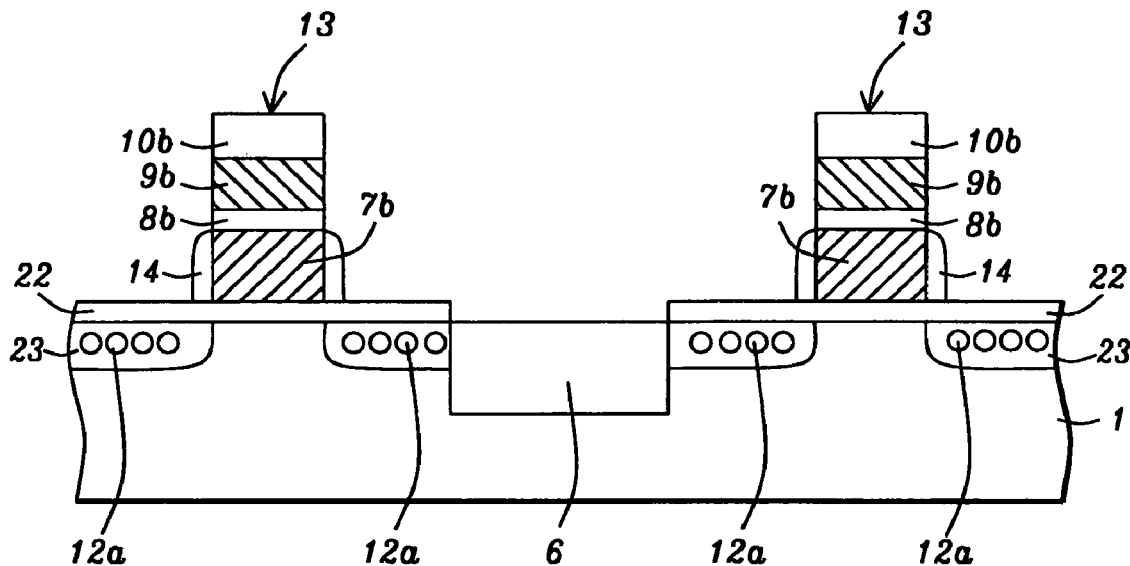

After removal of gate electrode defining photolithographic shape 11, again via plasma oxygen ashing and wet clean procedures, source/drain region 23 is formed in portions of semiconductor substrate 1 not covered by gate electrode stack 13. Source/drain region 23, schematically shown in FIG. 5, is obtained via ion implantation of arsenic or phosphorous ions at an energy between about 40 to 55 KeV for arsenic implant and between about 15 to 25 KeV for phosphorous implant, and at a dose between about 4.0 to 5.0 E12 atoms/$cm^2$. To ensure enhanced isolation of the gate electrode stack a selective oxidation procedure is next performed at a temperature between about 890 to 910° C., in an oxygen-steam ambient, to form silicon oxide spacers 14, at a thickness between about 25 to 35 Angstroms, on the sides of polysilicon shape 7b. This is schematically shown in FIG. 5. The selective oxidation procedure is performed at the highest furnace temperature used for the fabrication of the memory or DRAM device. This high temperature process activates and drives implanted arsenic or phosphorous ions of source/drain region 23 away from the top surface of semiconductor substrate 1, thus any defects caused by the gate defining gate electrode plasma etch procedure will not be passivated by the group V arsenic or phosphorous ions.

Figure 6:
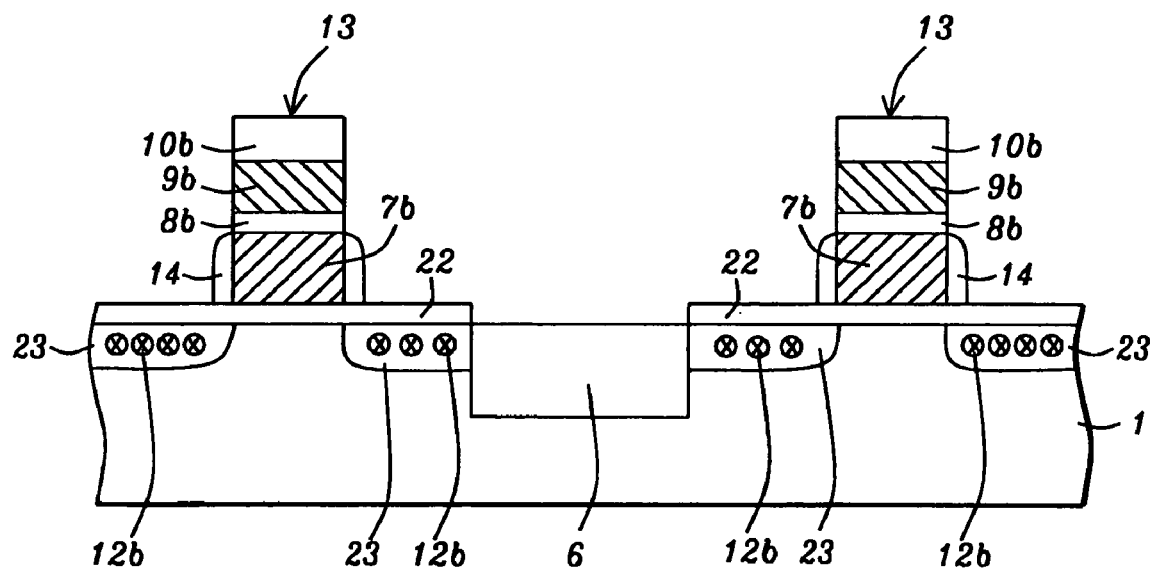

The key feature of this invention, the passivation of defects 12a, is next accomplished and schematically described in FIG. 6. After all high temperature steps have been completed, such as the high temperature selective oxidation of polysilicon shape 7b, a low energy implantation of specific group V ions, is performed. The preferred implanted ion is arsenic, however other slow diffusing group V elements such as antimony can also be employed. Phosphorous, a faster diffusing group V element is not a candidate for passivation of defects 12a. Implantation of arsenic ions is performed at an energy between about 30 to 50 e KeV, at a dose between about 1 to 3E12 atoms/$cm^2$. Arsenic being a heavy atom remains close to the top surface of semiconductor substrate 1 therefore passivating the unsaturated chemical bonds of defects 12a, which resulted from damage done to the semiconductor substrate surface during the plasma etch definition of gate stack 13. The now passivated defect 12b, shown schematically in FIG. 6, will no longer contribute to unwanted junction leakage or GIDL. It is critical that subsequent process steps be performed at low temperatures that will allow the slow diffusing arsenic ions to remain near the semiconductor surface. Thus all high temperature procedures such as the selective oxidation of polysilicon, were performed prior to the low energy implantation of the passivating arsenic ions.

Figure 7:
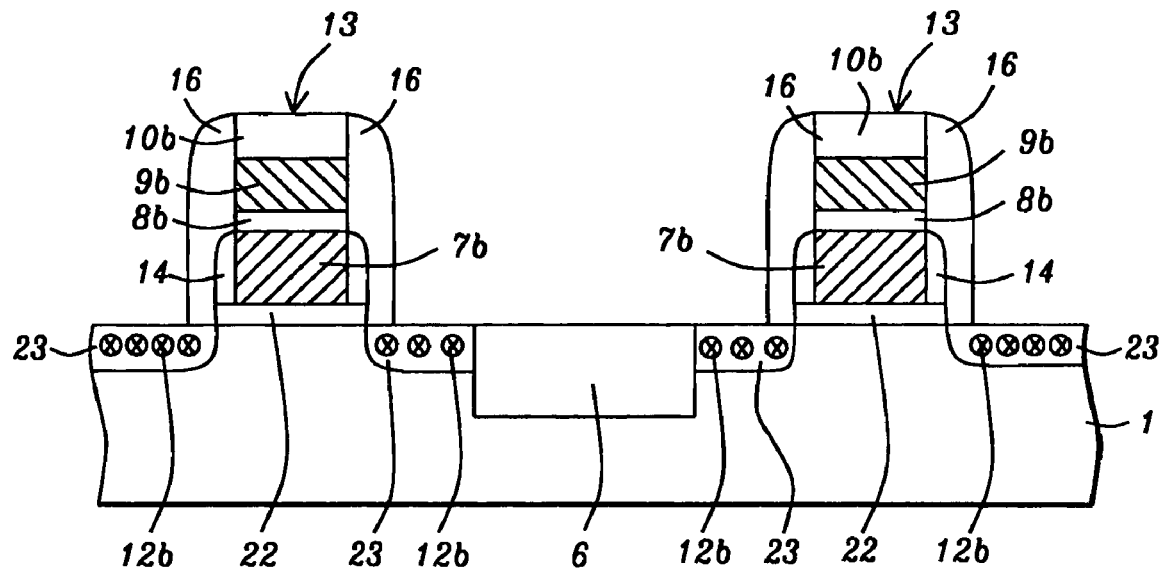

Prior to encapsulation of gate electrode stack 13, needed for isolation from subsequent metal lines and runners, portions of silicon dioxide gate insulator layer 22 not covered by gate electrode stack 13 is selectively removed via wet or dry etching procedures. Next silicon nitride spacers 16 are formed on the sides of gate electrode stack 13 accomplished via deposition of a silicon nitride layer using LPCVD or PECVD procedures at a thickness between about 335 to 385 Angstroms, followed by a blanket, anisotropic RIE procedure performed using $Cl_2$ or $CF_4$ as an etchant. The result of these procedures is schematically shown in FIG. 7.

Figure 8:
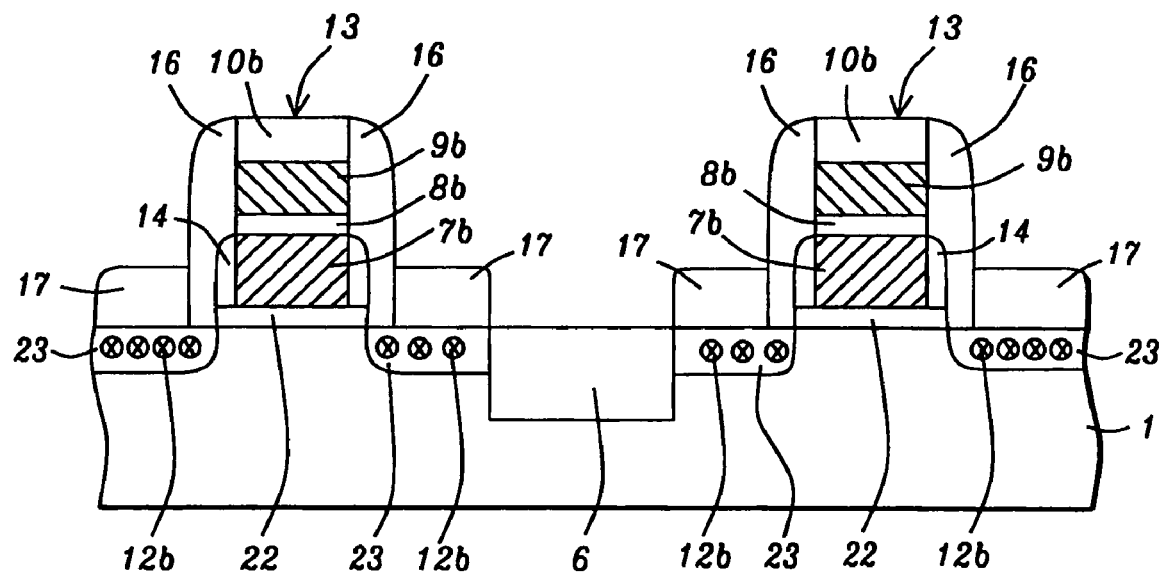

Raised source/drain contact shapes 17 comprised of silicon, are next formed on source/drain region 23. Raised source/drain shapes 17, shown schematically in FIG. 8 are used to reduce source drain contact resistance. Raised source/drain contact shapes 17 are formed at a thickness between about 540 to 580 Angstroms via CVD selective silicon growth performed at a temperature between about 840 to 860° C. Raised source/drain shapes 17 can be in situ doped during the selective growth formation via the addition of arsenic or phosphorous to a silane flow, or raised source/drain contact shapes 17 can be selectively grown intrinsically then doped via implantation of arsenic or phosphorous ions.

While this invention has been particularly shown and described with reference to, the preferred embodiments thereof, it will be understood by those skilled in the art that various changes in form and details may be made without departing from the spirit and scope of this invention.

What is claimed is:

1. A method of forming a metal oxide semiconductor (MOS) device on a semiconductor substrate featuring passivation of defects at or near the top surface of said semiconductor substrate, comprising the steps of:
   forming an insulator isolation region in a top portion of a first region of said semiconductor substrate;
   forming a gate insulator layer on a second region of said semiconductor substrate, wherein said second region is not occupied by said insulator isolation region;
   depositing a group of layers;
   performing a plasma dry etch procedure to remove said group of layers from a first portion of said gate insulator layer while defining a gate electrode structure comprised of said group of layers on a second portion of said gate insulator layer;
   performing a first ion implantation procedure to form a source/drain region in portions of said second region of said semiconductor substrate not overlaid by said gate electrode structure;
   forming a first insulator spacer on a lower portion of said gate electrode structure;
   performing a second ion implantation procedure placing implanted ions into a top portion of said source/drain region for passivating said defects;
   forming a second insulator spacer on said gate electrode structure and on said first insulator spacer; and
   forming raised source/drain contacts on top of exposed regions of said source/drain region.

2. The method of claim 1, wherein said gate insulator layer is a silicon dioxide layer obtained at a thickness between about 55 to 65 Angstroms, via thermal oxidation performed at a temperature between about 740 to 760° C., in an oxygen-steam ambient.

3. The method of claim 1, wherein said group of layers is comprised of an underlying polysilicon layer at a thickness between about 670 to 730 Angstroms, a barrier layer comprising tungsten nitride or titanium nitride at a thickness between about 140 to 160 Angstroms, and an overlying tungsten layer at a thickness between about 90 to 110 Angstroms.

4. The method of claim 1, wherein said plasma dry etch procedure used to define
   said gate electrode structure is an anisotropic reactive ion etch (RIE) procedure, performed using $Cl_2$ as an etchant for said group of layers.

5. The method of claim 1, wherein said first ion implantation procedure used to form said source/drain region is performed via implantation of arsenic or phosphorous ions at an energy between about 40 to 55 KeV for arsenic implant and between about 15 to 25 KeV for phosphorous implant, and at a dose between about 4.0 to 5.0 E12 atoms/$cm^2$.

6. The method of claim 1, wherein said first insulator spacer is silicon oxide spacer formed at a thickness between about 25 to 35 Angstroms via thermal oxidation performed at a temperature between about 890 to 910° C.

7. The method of claim 1, wherein said second ion implantation procedure is performed via implantation of group V ions with atomic mass equal or greater than that of arsenic, at an energy between about 30 to 50 KeV, and at a dose between about 1 to 3E12 atoms/$cm^2$.

8. The method of claim 1, wherein said second insulator spacer is silicon nitride spacer formed at a thickness between about 335 to 385 Angstroms.

9. The method of claim 1, wherein said raised source/drain contacts are comprised of silicon at a thickness between about 540 to 580 Angstroms, obtained via CVD selective growth procedures at temperature between about 840 to 860° C.

10. A method of forming a MOS device on a semiconductor substrate wherein defects located near the top surface of said semiconductor substrate are passivated via an arsenic implantation performed after completion of all high temperature furnace processing at temperatures above 890° C., comprising the steps of:
   forming a silicon dioxide gate insulating layer on said semiconductor substrate;
   depositing a composite layer on said silicon dioxide gate insulating layer, wherein said composite layer is comprised of an underlying polysilicon layer, a tungsten nitride layer, a tungsten layer and an overlying silicon nitride layer;
   performing a plasma dry etch procedure to remove portions of said composite layer from a second portion of said silicon dioxide gate insulating layer forming a gate electrode structure on a first portion of said silicon dioxide gate insulating layer with said gate electrode structure comprised of an underlying polysilicon shape defined from unremoved portions of said polysilicon layer, a tungsten nitride shape defined from unremoved portions of said tungsten nitride layer, a tungsten shape defined from unremoved portions of said tungsten layer and an overlying silicon nitride shape defined from unremoved portions of said silicon nitride layer and with said plasma dry etching procedure creating said defects in or near the top surface of a region of said semiconductor substrate underlying said second portion of said silicon dioxide gate insulating layer;

forming a source/drain region in portions of said semiconductor substrate not covered by said gate electrode structure;

performing a thermal oxidation procedure to form a silicon oxide spacer on the sides of said polysilicon shape defined from unremoved portions of said polysilicon layer; performing said arsenic implantation procedure through said second portion of silicon dioxide gate insulating layer and into a top portion of said source/drain region passivating said defects;

forming a silicon nitride spacer on sides of said gate electrode structure and on sides of said silicon oxide spacer; and forming raised source/drain silicon contacts on top of exposed regions of said source/drain region.

11. The method of claim 10, wherein said silicon dioxide gate insulating layer is obtained at a thickness between about 55 to 65 Angstroms, via thermal oxidation performed at a temperature between about 740 to 760° C., in an oxygen-steam ambient.

12. The method of claim 10, wherein said composite layer is comprised of said underlying polysilicon layer at a thickness between about 640 to 730 Angstroms, said tungsten nitride layer at a thickness between about 140 to 160 Angstroms, said tungsten layer at a thickness between about 90 to 110 Angstroms, and said overlying silicon nitride layer at a thickness between about 1425 to 1475 Angstroms.

13. The method of claim 10, wherein said plasma dry etch procedure used to define said gate electrode structure is an anisotropic reactive ion etch (RIE) procedure performed using $Cl_2$ as an etchant for said composite layer.

14. The method of claim 10, wherein said source/drain region is obtained via implantation of arsenic or phosphorous ions, performed at an energy between about 40 to 50 KeV for arsenic implant and between about 15 to 25 KeV for phosphorus implant, and at a dose between about 4.0 to 5.0 E12 atoms/cm$^2$.

15. The method of claim 10, wherein said silicon oxide spacer is formed at a thickness between about 25 to 35 Angstroms via said thermal oxidation performed at a temperature between about 890 to 910° C.

16. The method of claim 10, wherein said arsenic ion implantation procedure, used to passivate said defects, is performed at an energy between about 30 to 50 KeV, and at a dose between about 1 to 3E12 atoms/cm$^2$.

17. The method of claim 10, wherein said silicon nitride spacer is formed at a thickness between about 335 to 385 Angstroms.

18. The method of claim 10, wherein said raised source/drain silicon contacts are formed at a thickness between about 540 to 580 Angstroms, via selective CVD growth procedures at temperature between about 840 to 860° C.

* * * * *